United States Patent
Ray et al.

(10) Patent No.: US 10,527,744 B2
(45) Date of Patent: Jan. 7, 2020

(54) DATA-DRIVEN ESTIMATION OF STIMULATED RESERVOIR VOLUME

(71) Applicant: Halliburton Energy Services, Inc., Houston, TX (US)

(72) Inventors: Baidurja Ray, Houston, TX (US); Avi Lin, Houston, TX (US); Jianfu Ma, Pearland, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 221 days.

(21) Appl. No.: 15/510,029

(22) PCT Filed: Oct. 13, 2014

(86) PCT No.: PCT/US2014/060289
§ 371 (c)(1),
(2) Date: Mar. 9, 2017

(87) PCT Pub. No.: WO2016/060641
PCT Pub. Date: Apr. 21, 2016

(65) Prior Publication Data
US 2017/0299742 A1    Oct. 19, 2017

(51) Int. Cl.
*G01V 1/30* (2006.01)
*G06F 17/50* (2006.01)
(Continued)

(52) U.S. Cl.
CPC .............. *G01V 1/306* (2013.01); *G01V 1/288* (2013.01); *G01V 99/005* (2013.01);
(Continued)

(58) Field of Classification Search
CPC .. G01V 1/288; G01V 1/306; G01V 2210/646; G01V 2210/663; G01V 99/005; G06F 17/5009
See application file for complete search history.

(56) References Cited

U.S. PATENT DOCUMENTS 5,740,342 A * 4/1998 Kocberber ............. G06T 17/05
345/420
9,529,103 B2    12/2016 Ma et al.
(Continued)

FOREIGN PATENT DOCUMENTS

WO    2011/120152    10/2011

OTHER PUBLICATIONS

International Search Report and Written Opinion, Application No. PCT/US2014/060289; 12 pgs, dated Jul. 6, 2015.
(Continued)

*Primary Examiner* — Manuel A Rivera Vargas
*Assistant Examiner* — Yaritza H Perez Bermudez
(74) *Attorney, Agent, or Firm* — Baker Botts L.L.P.

(57) ABSTRACT

A method for improved data-driven estimation of a stimulated reservoir volume may generate an optimized surface that encloses a set of data points including microseismic event data corresponding to a treatment of a subterranean formation. A Delaunay triangulation may be performed on the set of data points to generate a set of polytopes. A Voronoi polygon may be generated about each data point and used to obtain a local density measure that is locally and adaptively determined for each data point. Based on the local density measure, polytopes in the set of polytopes may be discriminated for inclusion in the optimized surface.

24 Claims, 9 Drawing Sheets

(51) Int. Cl.
*G01V 1/28* (2006.01)
*G01V 99/00* (2009.01)

(52) U.S. Cl.
CPC .... *G06F 17/5009* (2013.01); *G01V 2210/646* (2013.01); *G01V 2210/663* (2013.01)

(56) References Cited

U.S. PATENT DOCUMENTS

| | | | |
|---|---|---|---|
| 2009/0040217 A1* | 2/2009 | Kase | G06F 17/5018 345/420 |
| 2011/0120705 A1* | 5/2011 | Walters | E21B 43/16 166/270 |
| 2012/0143575 A1* | 6/2012 | Imhof | G01V 11/00 703/2 |
| 2013/0081805 A1* | 4/2013 | Bradford | G01V 1/40 166/250.1 |
| 2013/0304437 A1 | 11/2013 | Ma et al. | |
| 2014/0236559 A1* | 8/2014 | Fung | E21B 41/00 703/10 |
| 2016/0061020 A1* | 3/2016 | Sayarpour | E21B 43/14 166/250.01 |

OTHER PUBLICATIONS

H. Edelsbrunner, E. P. Mucke, "Three-Dimensional Alpha Shapes," 1994, ACM Transactions on Graphics, 13(1).

Y. Sun, "Surface Reconstruction using Gamma Shapes," 2006, Ph.D. thesis, The University of Alabama at Birmingham.

M. de Berg, O. Cheong, M. van Krevald, M. Overmars, "Computational Geometry: Algorithms and Applications," 3rd Ed. 2008, Springer.

Borut Žalik & Ivana Kolingerová, "An incremental construction algorithm for Delaunay triangulation using the nearest-point paradigm," International Journal of Geographical Information Science, 17:2, 119-138, DOI: 10.1080/713811749, 2003.

A. Lin, J. Ma, "Stimulated Rock Information in Multistage Hydraulic Fracturing Treatment," 2013. SPE/EAGE European Unconventional Resources Conference and Exhibition, Feb. 25-27, Vienna, Austria.

M. Teichmann, M. Capps, "Surface Reconstruction with Anisotropic Density-Scaled Alpha Shapes," 1998. Visualization '98, Proceedings, 67(72).

* cited by examiner

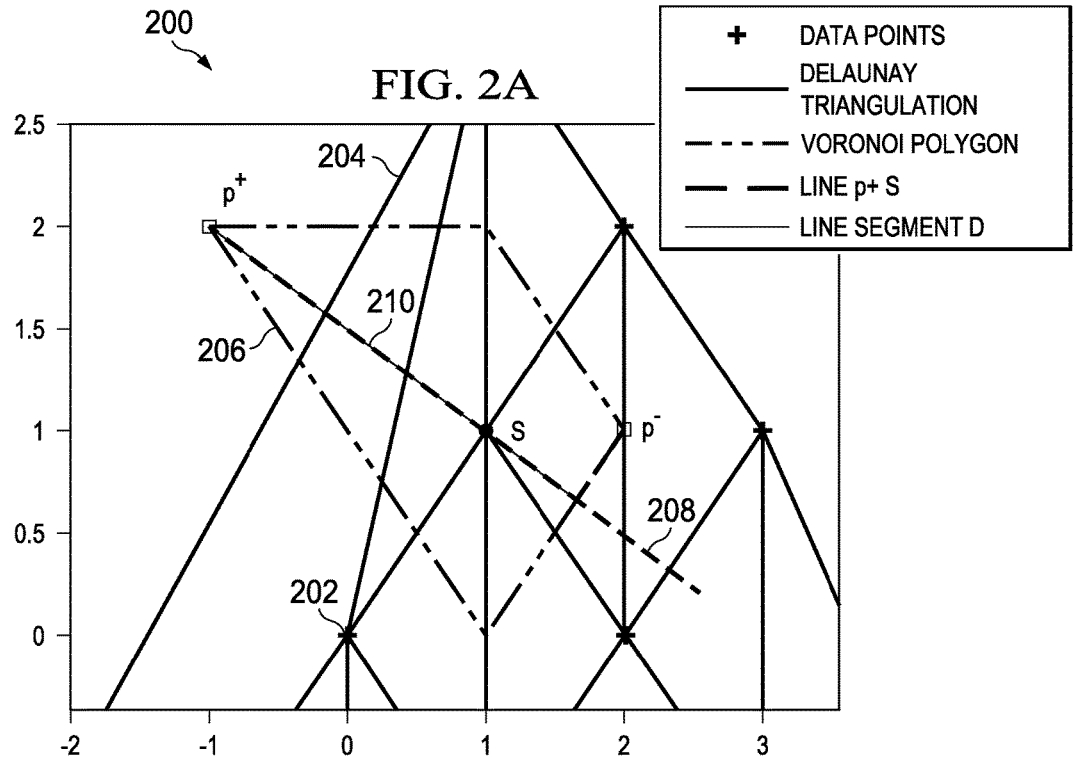
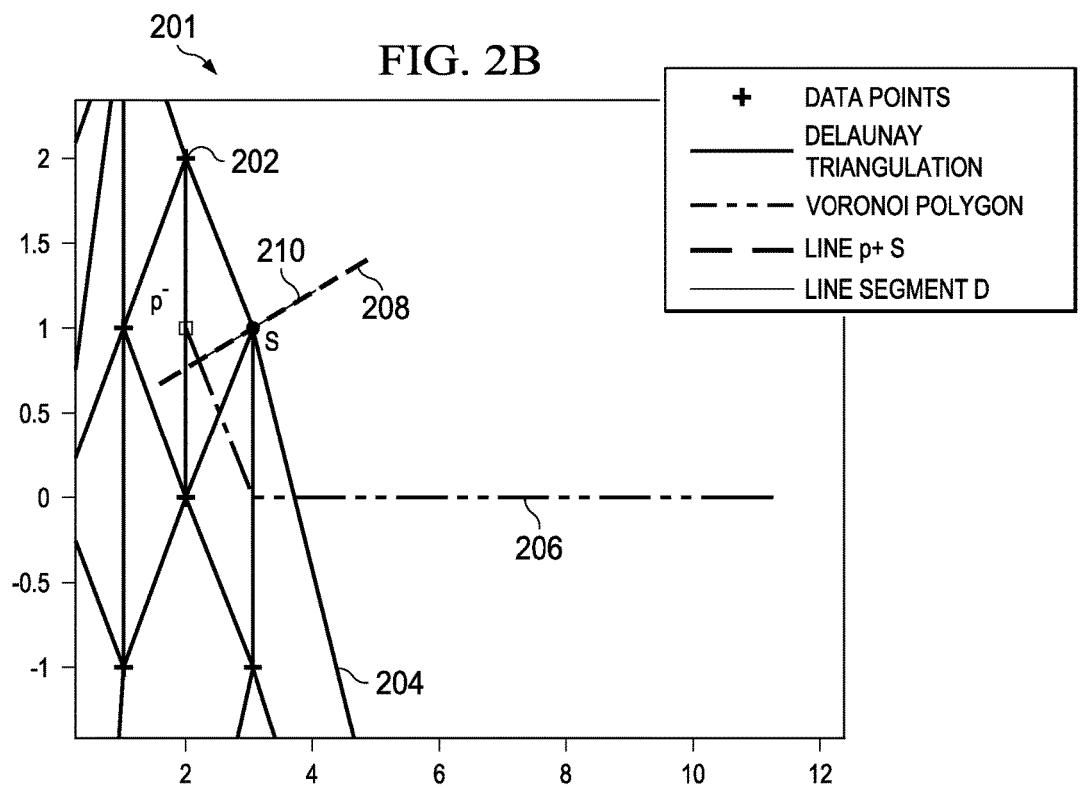

METHOD FOR GENERATING
AN OPTIMIZED SURFACE
FROM A SET OF DATA POINTS
400

402 — TRIANGULATE A SET OF DATA POINTS ACCORDING TO THE DELAUNAY TRIANGULATION ALGORITHM TO GENERATE A SET OF POLYTOPES, EACH OF THE POLYTOPES P HAVING VERTICES FROM THE SET OF DATA POINTS, AND THE SET OF POLYTOPES BEING BOUNDED BY A CONVEX HULL

404 — FOR EACH POINT S IN THE SET OF DATA POINTS, GENERATE A VORONOI POLYGON V ABOUT S

406 — BASED ON THE VORONOI POLYGON V RESPECTIVELY FOR EACH POINT S, DETERMINE A VALUE d FOR EACH POINT S, THE VALUE d BEING INDICATIVE OF THE INVERSE OF A LOCAL DENSITY IN THE SET OF DATA POINTS AT THE POINT S

408 — FOR EACH POLYTOPE P, DETERMINE WHETHER P IS RETAINED FOR AN OPTIMIZED SURFACE, BASED ON THE VALUES d FOR EACH POINT S CORRESPONDING TO A VERTEX OF P

410 — GENERATE THE OPTIMIZED SURFACE FROM THE RETAINED POLYTOPES P

412 — IDENTIFY A STIMULATED RESERVOIR VOLUME (SRV) FOR THE TREATMENT BASED ON THE OPTIMIZED SURFACE

FIG. 4

DATA-DRIVEN ESTIMATION OF STIMULATED RESERVOIR VOLUME

RELATED APPLICATIONS

This application is a U.S. National Stage Application of International Application No. PCT/US2014/060289 filed Oct. 13, 2014, which designates the United States, and which is incorporated herein by reference in its entirety.

TECHNICAL FIELD

This disclosure relates generally to shape reconstruction algorithms and, more particularly, to an improved data-driven estimation of stimulated reservoir volume (SRV) using locally adaptive alpha shapes.

BACKGROUND

Hydrocarbons, such as oil and gas, are commonly obtained from subterranean formations that may be located onshore or offshore. The development of subterranean operations and the processes involved in removing hydrocarbons from a subterranean formation are complex. Typically, subterranean operations involve a number of different steps such as, for example, drilling a borehole at a desired well site, treating the borehole to optimize production of hydrocarbons, and performing the necessary steps to produce and process the hydrocarbons from the subterranean formation.

Microseismic event data are often acquired in association with stimulation treatments applied to a subterranean formation. The injection treatments are typically applied to induce fractures in the subterranean formation, and thereby enhance hydrocarbon productivity of the subterranean formation. Pressures generated by a stimulation treatment may induce low-amplitude or low-energy seismic events in the subterranean formation, while such microseismic events may be detected by sensors, generating microseismic event data that is collected for analysis.

In particular for hydraulic fracturing treatments, microseismic event data may be used to estimate a stimulated reservoir volume (SRV) in order to characterize a subterranean reservoir of hydrocarbons. Because the precise location of the microseismic events are included with the microseismic data, an enclosed volume from the set of microseismic event data may represent the SRV for a given subterranean reservoir. One typical method of computing the SRV of a subterranean reservoir is to generate a minimum convex polygon (also referred to as a "convex hull") that completely encloses a set of microseismic data obtained from the subterranean reservoir. However, due to the convexity constraint, the minimum convex polygon may also enclose large unstimulated voids, which may lead to an undesirable overestimation of the SRV for a given subterranean reservoir.

FIGURES

Some specific exemplary embodiments of the disclosure may be understood by referring, in part, to the following description and the accompanying drawings.

FIGS. 2A and 2B are plots of triangulated data sets, in accordance with embodiments of the present disclosure;

Figure 3A:
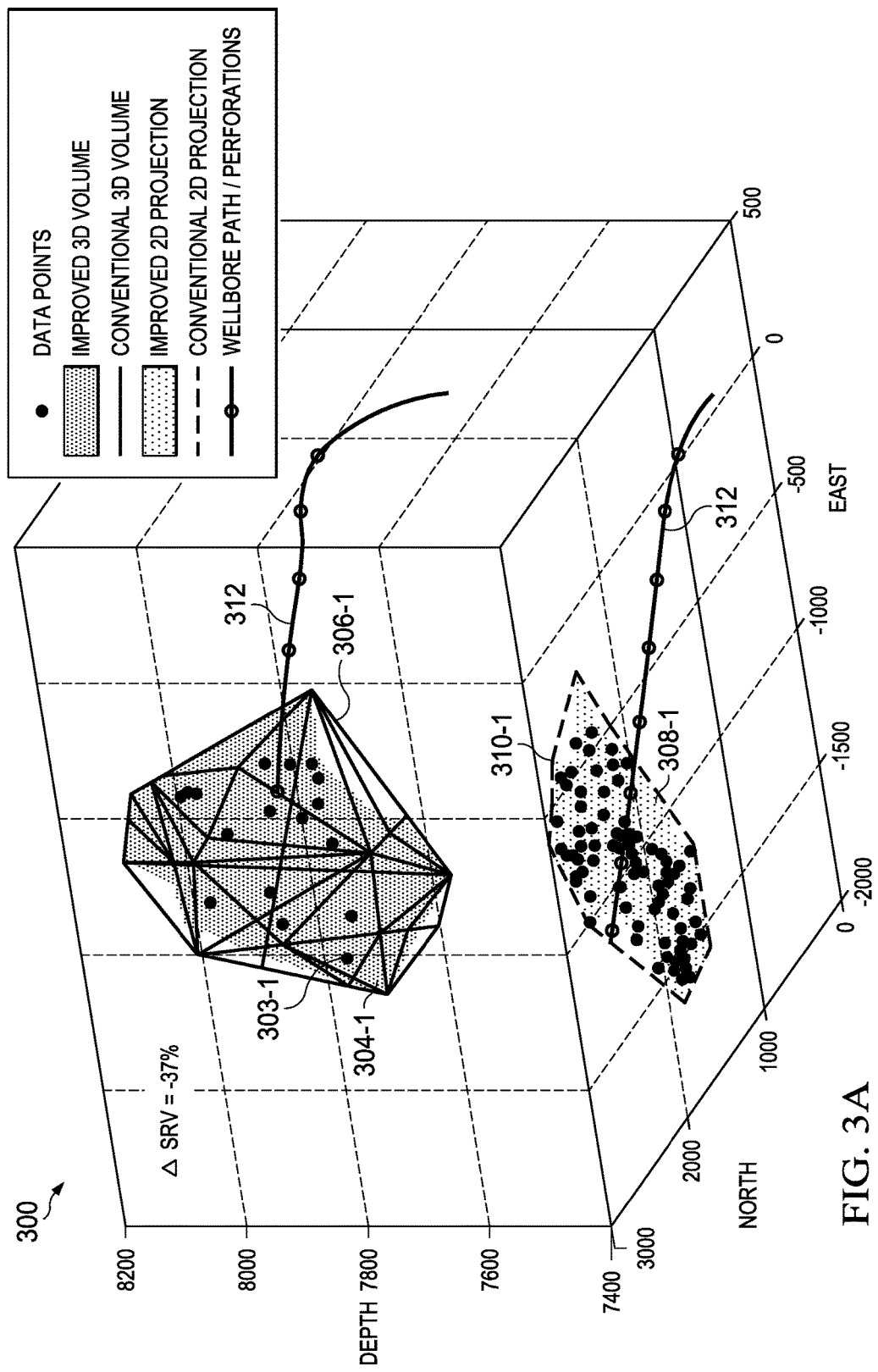
Figure 3B:
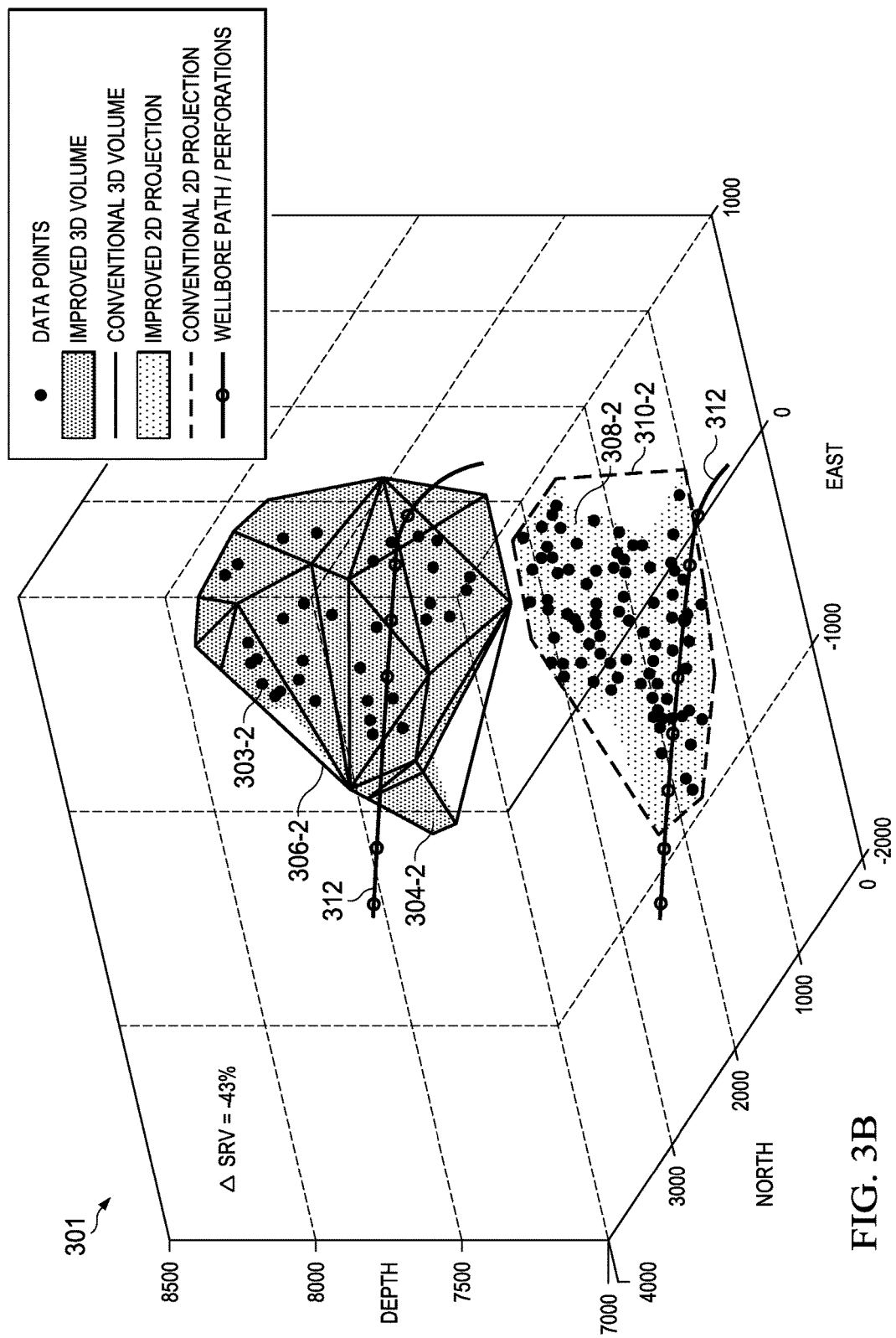
Figure 3C:
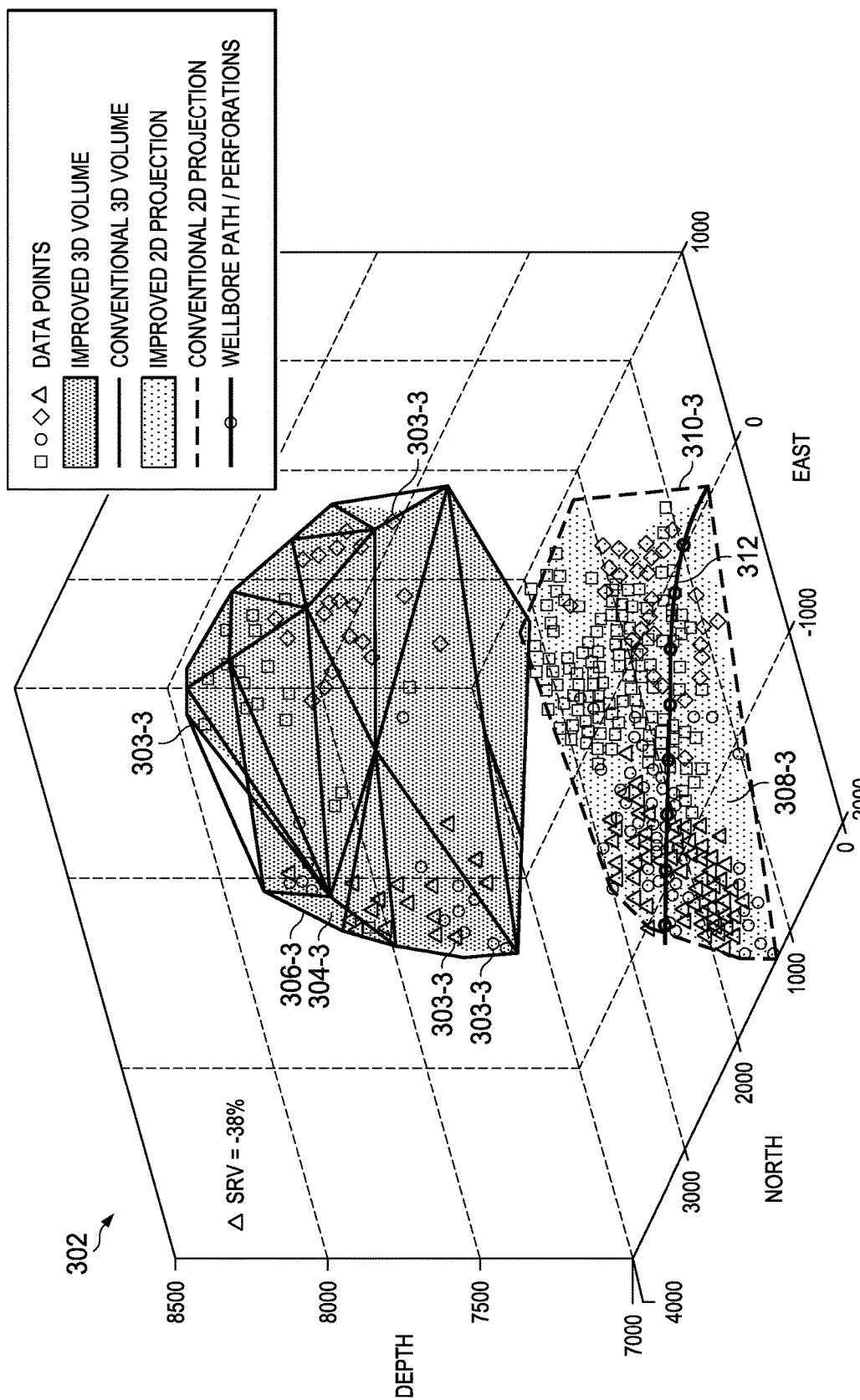
Figure 5:
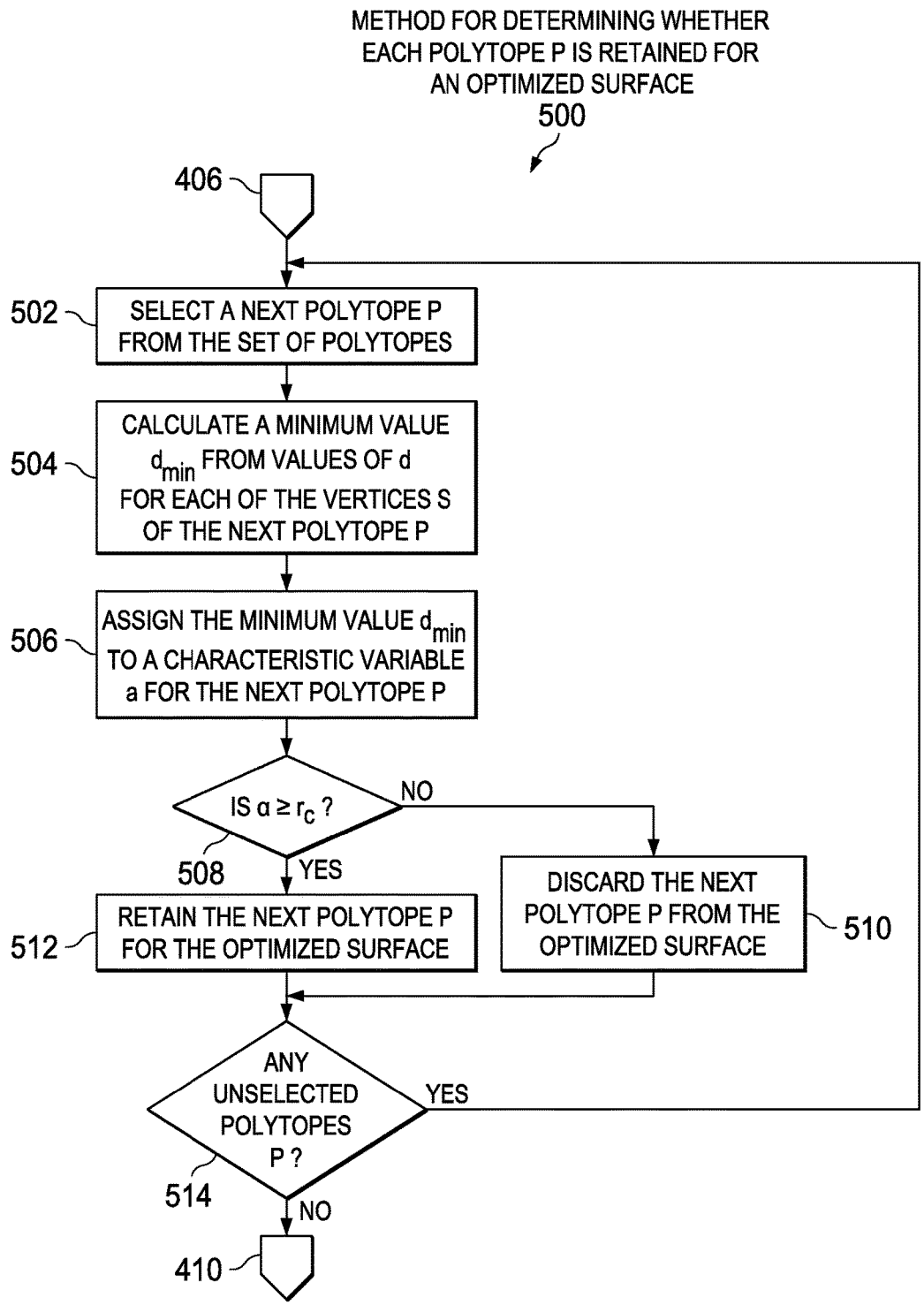
Figure 6:
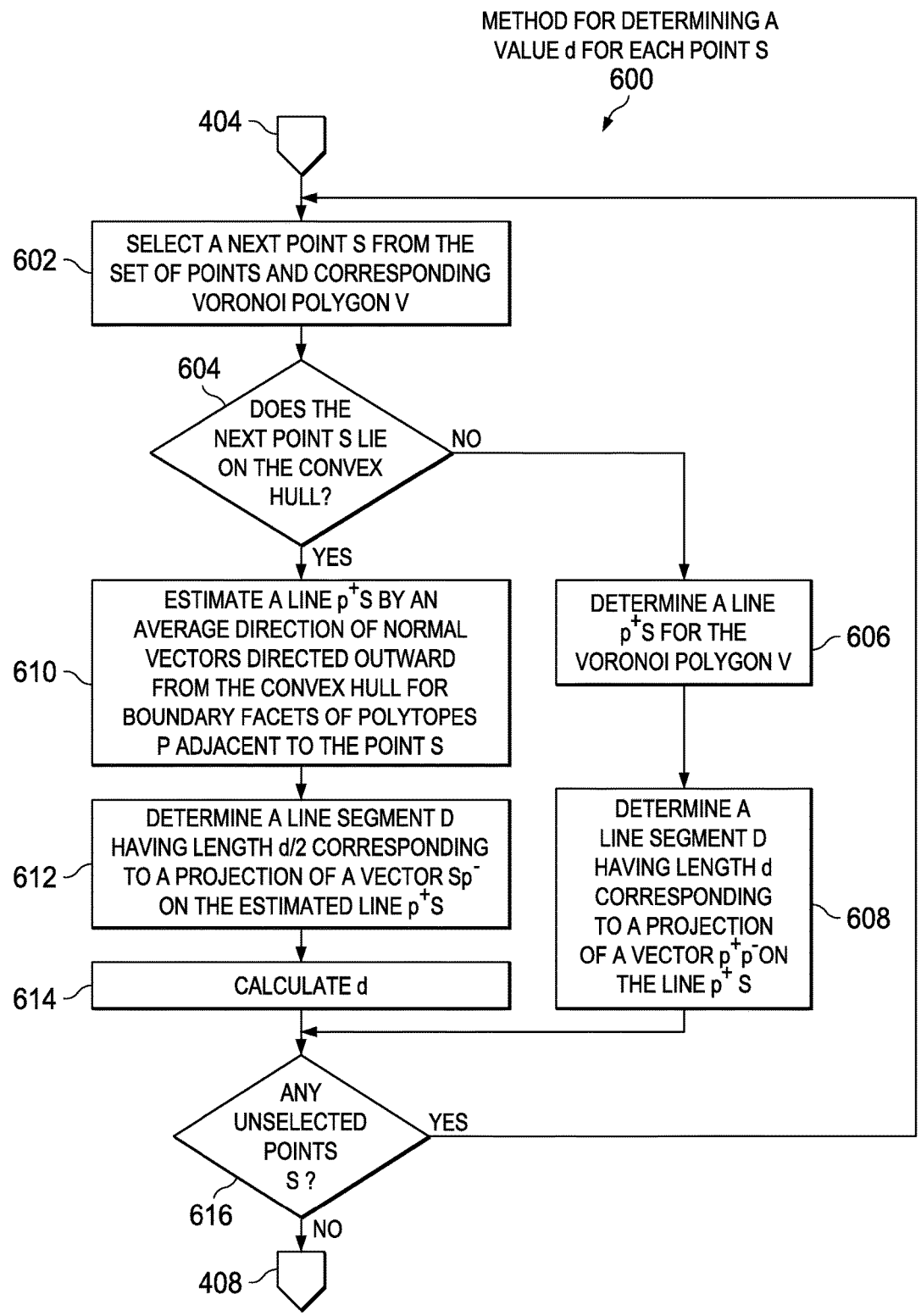

FIGS. 3A, 3B, and 3C are plots of an improved data-driven estimation of SRV using locally adaptive alpha shapes, in accordance with embodiments of the present disclosure;

FIG. 4 is a flow chart illustrating a method for generating an optimized surface from a set of data points, in accordance with embodiments of the present disclosure;

FIG. 5 is a flow chart illustrating a method for determining whether each polytope P is retained for an optimized surface, in accordance with embodiments of the present disclosure; and FIG. 6 is a flow chart illustrating a method for determining a value d for each point S, in accordance with embodiments of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and are not exhaustive of the scope of the disclosure.

DESCRIPTION OF PARTICULAR EMBODIMENT(S)

The present disclosure relates generally to shape reconstruction algorithms and, more particularly, to an improved data-driven estimation using locally adaptive alpha shapes of an enclosed volume. The enclosed volume is estimated by generating an optimized surface that encloses a set of data points. In particular applications, the enclosed volume is an SRV and a density optimized alpha-shape (DOAS) algorithm may be used for an improved data-driven estimation of SRV using locally adaptive alpha shapes.

As used herein, a hyphenated form of a reference numeral refers to a specific instance of an element and the un-hyphenated form of the reference numeral refers to the collective element. Thus, for example, device "72-1" refers to an instance of a device class, which may be referred to collectively as devices "72" and any one of which may be referred to generically as device "72".

To facilitate a better understanding of the present disclosure, the following examples are presented for descriptive purposes. In no way should the following examples be read to limit, or define, the scope of the disclosure. Embodiments of the present disclosure may be applicable to horizontal, vertical, deviated, multilateral, u-tube connection, intersection, bypass (drill around a mid-depth stuck fish and back into the well below), or otherwise nonlinear boreholes in any type of subterranean formation. Embodiments may be applicable to injection wells as well as production wells, including natural resource production wells such as hydrogen sulfide, hydrocarbons or geothermal wells. Devices and methods in accordance with embodiments described herein may be used in one or more of wire line, slick line, measurement while drilling (MWD) and logging while drilling (LWD) operations. Embodiments described below with respect to one implementation, such as wire line, are not intended to be limiting. Embodiments may be implemented in various formation tools suitable for measuring, data acquisition and/or recording data along sections of the formation that, for example, may be conveyed through flow passage in tubular string or using a wire line, slick line, tractor, piston, piston-tractor, coiled tubing, downhole robot or the like.

In some aspects of the present disclosure, a microseismic supported stimulated reservoir volume (SRV) for a treatment of a subterranean region is approximated and calculated from microseismic data. In some embodiments, a treatment fractures part of a rock formation or other materials in a subterranean region. Fracturing a rock may increase the surface area of a formation, which may increase the rate at which the formation conducts hydrocarbon resources to a wellbore. An SRV may be proportional to or otherwise indicate the volume of a subterranean region that was effectively stimulated and fractured, or otherwise affected by a stimulation treatment. For example, an SRV may represent a volume in which fractures or fracture networks were created, dilated, or propagated by a stimulation treatment. An SRV may represent a volume of a subterranean region contacted by treatment fluid from a stimulation treatment. In some embodiments, an SRV may be obtained based on a volume of a cloud of microseismic events associated with fracture planes generated by a stimulation treatments.

In some embodiments, an SRV may be used to evaluate the efficiency of an injection treatment and to assess treatment performance. For example, a more consistent and accurate estimation or prediction of SRV may provide a useful tool for analyzing a stimulated reservoir. In some embodiments, geometric properties of an SRV, SRV overlaps, or dynamic properties of an SRV, or other types of information are approximated based on calculations from microseismic event data. In some embodiments, an SRV overlap, geometric properties of an SRV, or dynamic properties of an SRV are dynamically identified and displayed, for example, in real-time during a stimulation treatment. In some embodiments, techniques described herein may provide users (e.g., field engineers, operational engineers and analysts, and others) with a reliable and direct tool to visualize a stimulated reservoir geometry and treatment field development, to evaluate efficiency of hydraulic fracturing treatments, to modify or otherwise manage a treatment plan, or to perform other types of analysis or design.

An improved data-driven estimation of an enclosed volume is described herein for surface reconstruction using a set of data points that each include location information. Although the disclosure is described in detail for microseismic event data points used to estimate an SRV for hydraulic fracturing, it will be understood that the methods and operations disclosed herein are not limited to hydraulic fracturing and may be applicable to other types of data sets, such as population data, computer graphics rendering of objects, etc.

Figure 1A:
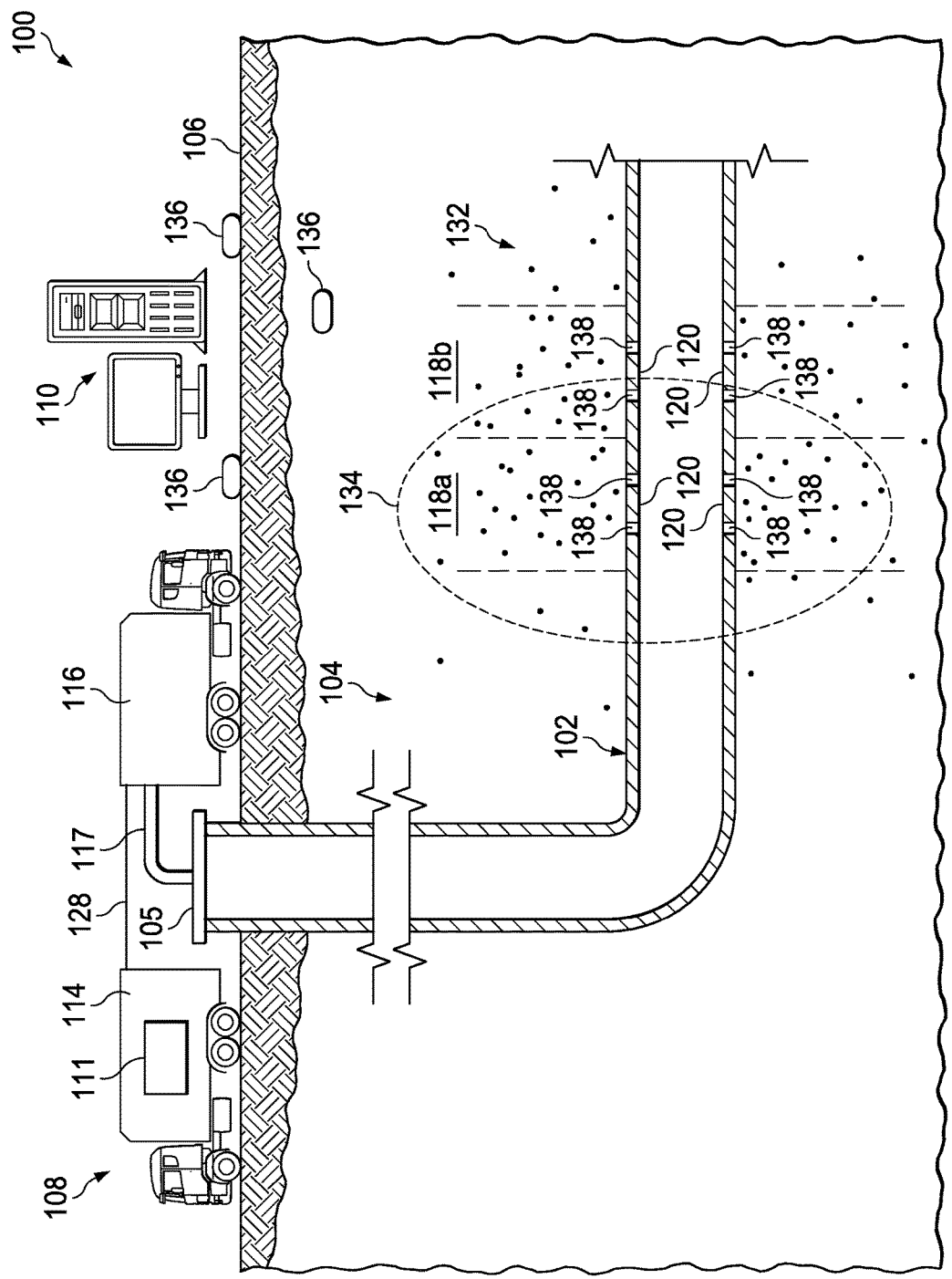
FIG. 1A shows a cross section of an exemplary well system, in accordance with some embodiments of the present disclosure.

Referring now to the drawings, FIG. 1A is a cross-sectional view of an exemplary well system 100, in accordance with embodiments of the present disclosure. FIG. 1A is a schematic representation of selected elements of an embodiment of well system 100 and is not drawn to scale. It will be understood that the present disclosure is applicable to different embodiments of well systems. Well system 100 may include wellbore 102 in subterranean region 104 beneath ground surface 106. Wellbore 102, as shown in FIG. 1A, may include a horizontal wellbore. However, well system 100 may include any combination of horizontal, vertical, slant, curved, or other wellbore orientations. Well system 100 may include one or more additional treatment wells, observation wells, or other types of wells. Subterranean region 104 may include a reservoir that contains hydrocarbon resources, such as oil, natural gas, or others.

For example, subterranean region 104 may include all or part of a rock formation (e.g., shale, coal, sandstone, granite, or others) that contains natural gas. Subterranean region 104 may include naturally fractured rock or natural rock formations that are not fractured to any significant degree. Subterranean region 104 may include tight gas formations of low permeability rock (e.g., shale, coal, or others).

Well system 100 may also include injection system 108. In some embodiments, injection system 108 may perform a treatment, for example, by injecting fluid into subterranean region 104 through wellbore 102. In some embodiments, a treatment fractures part of a rock formation or other materials in subterranean region 104. In such examples, fracturing a rock may increase the surface area of a formation, which may increase the rate at which the formation conducts hydrocarbon resources to wellbore 102.

Injection system 108 may be used to perform one or more treatments including, for example, injection treatments or flow back treatments. For example, injection system 108 may apply treatments including single-stage injection treatments, multi-stage injection treatments, mini-fracture test treatments, follow-on fracture treatments, re-fracture treatments, final fracture treatments, other types of fracture treatments, or any suitable combination of treatments. An injection treatment may be, for example, a multi-stage injection treatment where an individual injection treatment is performed during each stage. A treatment may be applied at a single fluid injection location or at multiple fluid injection locations in a subterranean region, and fluid may be injected over a single time period or over multiple different time periods. In some instances, a treatment may use multiple different fluid injection locations in a single wellbore, multiple fluid injection locations in multiple different wellbores, or any suitable combination. Moreover, a treatment may inject fluid through any suitable type of wellbore, such as, for example, vertical wellbores, slant wellbores, horizontal wellbores, curved wellbores, or any suitable combination of these and others.

Injection system 108 may inject treatment fluid into subterranean region 104 through wellbore 102. Injection system 108 may include instrument truck 114, pump truck 116, and injection treatment control subsystem 111. Injection system 108 may include other features not shown in the figures. Although FIG. 1A depicts a single instrument truck 114 and a single pump truck 116, any suitable number of instrument trucks 114 and pump trucks 116 may be used. Although an embodiment with equipment on trucks is depicted for descriptive purposes with respect to FIG. 1A, it is noted that immobile installations with similar functionality may be used in different embodiments of well system 100.

Pump trucks 116 may communicate treatment fluids into wellbore 102, for example, through conduit 117, at or near the level of ground surface 106. Pump trucks 116 may include mobile vehicles, skids, hoses, tubes, fluid tanks, fluid reservoirs, pumps, valves, mixers, or other types of structures and equipment. Pump trucks 116 may supply treatment fluid or other materials for a treatment. Pump trucks 116 may contain multiple different treatment fluids, proppant materials, or other materials for different stages of a treatment. Treatment fluids may be communicated through wellbore 102 from ground surface 106 level by a conduit installed in wellbore 102. The conduit may include casing cemented to the wall of wellbore 102. In some embodiments, all or a portion of wellbore 102 may be left open, without casing. The conduit may include a working string, coiled tubing, sectioned pipe, or other types of conduit.

Instrument trucks 114 may include injection treatment control subsystem 111, which controls or monitors the treatment applied by injection system 108. Instrument trucks 114 may include mobile vehicles or other suitable structures. Injection treatment control subsystem 111 may control operation of injection system 108. Injection treatment control subsystem 111 may include data processing equipment, communication equipment, or other systems that control stimulation treatments applied to subterranean region 104 through wellbore 102. Injection treatment control subsystem 111 may include or be communicatively coupled to a computing system (e.g., computing subsystem 110) that calculates, selects, or optimizes treatment parameters for initialization, propagation, or opening fractures in subterranean region 104. Injection treatment control subsystem 111 may receive, generate or modify a stimulation treatment plan (e.g., a pumping schedule) that specifies properties of a treatment to be applied to subterranean region 104.

Injection system 108 may use multiple treatment stages or intervals, such as stage 118a and stage 118b (collectively "stages 118"). Injection system 108 may delineate fewer stages or multiple additional stages beyond the two exemplary stages 118 shown in FIG. 1A. Stages 118 may each have one or more perforation clusters 120 that include one or more perforations 138. Fractures in subterranean region 104 may be initiated at or near perforation clusters 120 or elsewhere. Stages 118 may have different widths or may be uniformly distributed along wellbore 102. Stages 118 may be distinct, nonoverlapping (or overlapping) injection zones along wellbore 102. In some embodiments, each stage 118 may be isolated from other stages 118, for example, by packers or other types of seals in wellbore 102. In some embodiments, each stage 118 may be treated individually, for example, in series along wellbore 102. Injection system 108 may perform identical, similar, or different injection treatments at different stages 118.

A treatment, along with other activities and natural phenomena, may generate microseismic events in subterranean region 104. For example, injection system 108 may cause multiple microseismic events 132 during a multi-stage injection treatment. Microseismic event data may be collected from subterranean region 104. Microseismic event data detected in well system 100 may be generated from acoustic signals of natural phenomena, acoustic signals associated with a stimulation treatment applied through wellbore 102, or other types of signals. For instance, sensors 136 may detect acoustic signals generated by rock slips, rock movements, rock fractures or other events in subterranean region 104. In some instances, the locations of individual microseismic events may be determined based on the microseismic event data. Microseismic events in subterranean region 104 may occur, for example, along or near induced hydraulic fractures. The microseismic events may be associated with pre-existing natural fractures or hydraulic fracture planes induced by fracturing activities. Microseismic event data from a stimulation treatment may include information collected before, during, or after fluid injection.

Wellbore 102 may include sensors 136, microseismic array, and other equipment that may be used to detect the acoustic signals and to generate the microseismic event data. Sensors 136 may include geophones or other types of listening equipment. Sensors 136 may be located at a variety of positions in well system 100. In some embodiments, computing subsystem 110 may be configured to identify subset 134 of microseismic events 132 associated with a single treatment stage (e.g., treatment stage 118a) of a multi-stage injection treatment. For example, subset 134 of microseismic events 132 are shown inside a circle in FIG. 1A. In some embodiments, subset 134 of microseismic events 132 may be identified based on a time that they occurred, and subset 134 may be filtered or otherwise modified to exclude outliers or other event points. Subset 134 of microseismic events 132 may be selected from a superset of microseismic events 132 based on any suitable criteria. In some cases, subset 134 of microseismic events 132 may be used to identify an SRV associated with a particular stage of a treatment, such as stage 118a.

As shown in FIG. 1A, sensors 136 may be installed at surface 106 and beneath surface 106 (e.g., in an observation well (not shown)). Additionally or alternatively, sensors 136 may be positioned in other locations above or below ground surface 106, in other locations within wellbore 102, or within another associated wellbore (e.g., another treatment well or an observation well). Wellbore 102 may include additional equipment (e.g., working string, packers, casing, or other equipment) not shown in FIG. 1A.

Sensors 136 or other detecting equipment in well system 100 may detect the microseismic events, and collect and transmit the microseismic event data, for example, to computing subsystem 110. In the embodiment shown in FIG. 1A, computing subsystem 110 may be located above ground surface 106. In various embodiments, computing subsystem 110 may include one or more computing devices or systems located at the wellbore 102, or in other locations. In some embodiments, at least a portion of computing subsystem 110 may be located apart from the other components shown in FIG. 1A. For example, computing subsystem 110 may be located at a data processing center, a computing facility, or another suitable location. In some cases, all or part of computing subsystem 110 may be contained in a technical command center at a well site, in a real-time operations center at a remote location, in another appropriate location, or any suitable combination thereof.

Computing subsystem 110 may receive and analyze microseismic event data. For example, computing subsystem 110 may analyze microseismic event data from a stimulation treatment of subterranean region 104. Computing subsystem 110 may receive microseismic event data at any suitable time. In some instances, computing subsystem 110 may receive microseismic event data in real time (or substantially in real time) during a treatment. For example, microseismic event data may be sent to computing subsystem 110 upon detection by sensors 136. In some instances, computing subsystem 110 receives some or all of the microseismic event data after a fracture treatment has been completed. Computing subsystem 110 may receive the microseismic event data in any suitable format. For example, computing subsystem 110 may receive the microseismic event data in a format produced by microseismic sensors or detectors, or computing subsystem 110 may receive microseismic event data after formatting, packaging, or other types of processing on the microseismic event data has been performed. Computing subsystem 110 may receive microseismic event data, for example, by a wired or wireless communication link, by a wired or wireless network, or by one or more disks or other tangible media.

In some embodiments, computing subsystem 110 may identify an SRV for a treatment based on microseismic event data. The SRV may be computed for an individual stage or for a multistage treatment as a whole. In some instances, the computed SRV may be presented to users to visualize and analyze the temporal and spatial evolution of the SRV. In some implementations, microseismic event data may be collected, communicated, and analyzed in real time during an injection treatment. In some implementations, a computed SRV may be provided to injection treatment control subsystem 111. A current or a prospective treatment strategy may be adjusted or otherwise managed based on a computed SRV data, for example, to improve the efficiency of the injection treatment.

Computing subsystem 110 may be configured to perform additional or different operations. Computing subsystem 110 may perform, for example, fracture mapping and matching based on collected microseismic event data to identify fracture orientation trends and extract fracture network characteristics. These characteristics may include fracture orientation (e.g., azimuth and dip angle), fracture size (e.g., length, height, surface area), fracture spacing, fracture complexity, or another property. In some implementations, computing subsystem 110 may identify an SRV for a stimulation treatment applied to subterranean region 104, identify an overlapping volume of SRVs between stages of a stimulation treatment, or other information.

Well system 100 and computing subsystem 110 may include or access any suitable communication infrastructure. Communication links 128 may allow instrument trucks 114 to communicate with pump trucks 116, or other equipment at ground surface 106. Additional communication links may allow instrument trucks 114 to communicate with sensors or data collection apparatus in well system 100, remote systems, other well systems, equipment installed in wellbore 102 or other devices and equipment. For example, well system 100 may include multiple separate communication links or a network of interconnected communication links. These communication links may include wired or wireless communications systems. For example, sensors 136 may communicate with instrument trucks 114 or computing subsystem 110 through wired or wireless links or networks, or instrument trucks 114 may communicate with computing subsystem 110 through wired or wireless links or networks. These communication links may include a public data network, a private data network, satellite links, dedicated communication channels, telecommunication links, or any suitable combination of these and other communication links.

Well system 100 may include additional or different features, and the features of well system 100 may be arranged as shown in FIG. 1A, or in another suitable configuration. Some of the techniques and operations described herein may be implemented by a computing subsystem configured to provide the functionality described. In various embodiments, a computing system may include any of various types of devices, including, but not limited to, personal computer systems, desktop computers, laptops, notebooks, mainframe computer systems, handheld computers, workstations, tablets, application servers, storage devices, computing clusters, or any type of computing or electronic device.

Figure 1B:
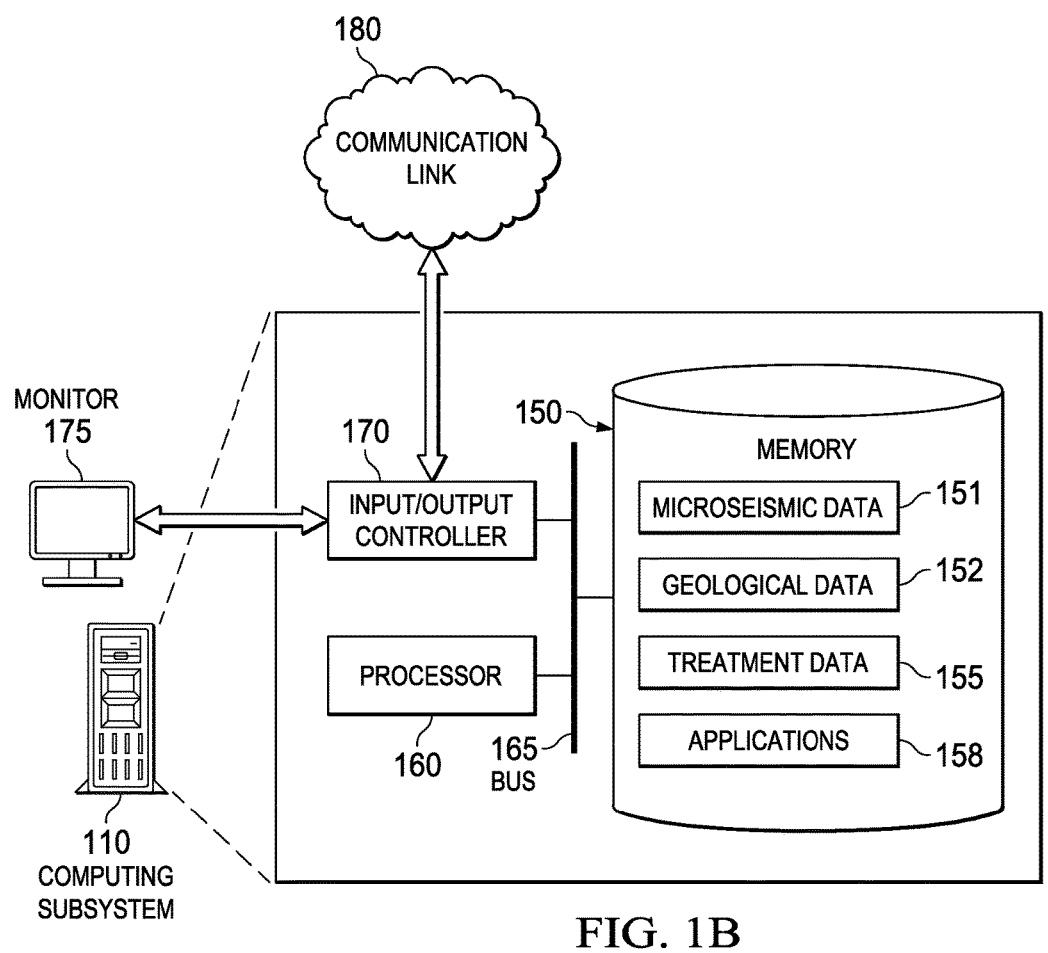
FIG. 1B is a block diagram of an exemplary computing subsystem of FIG. 1A, in accordance with some embodiments of the present disclosure.

Referring now to FIG. 1B, an exemplary computing subsystem 110 of FIG. 1A, in accordance with some embodiments of the present disclosure, is depicted. Computing subsystem 110 may be located at or near one or more wellbores of well system 100 or at a remote location. All or part of computing subsystem 110 may operate as a component of or independent of well system 100 or independent of any other components shown in FIG. 1A. Computing subsystem 110 may include memory 150, processor 160, and input/output controllers 170 communicatively coupled by bus 165.

Processor 160 may include hardware for executing instructions, such as those making up a computer program, such as any one of applications 158. As an example and not by way of limitation, to execute instructions, processor 160 may retrieve (or fetch) the instructions from an internal register, an internal cache, memory 150; decode and execute them; and then write one or more results to an internal register, an internal cache, memory 150. In some embodiments, processor 160 may execute instructions, for example, to generate output data based on data inputs. For example, processor 160 may run application 158 by executing or interpreting software, scripts, programs, functions, executables, or other modules contained in application 158. Processor 160 may perform one or more operations related to FIGS. 2A, 2B, and 3-5. Input data received by processor 160 or output data generated by processor 160 may include microseismic data 151, geological data 152.

Memory 150 may include, for example, random access memory (RAM), a storage device (e.g., a writable read-only memory (ROM) or others), a hard disk, a solid state storage device, or another type of storage medium. Computing subsystem 110 may be preprogrammed or it may be programmed (and reprogrammed) by loading a program from another source (e.g., from a CD-ROM, from another computer device through a data network, or in another manner). In some embodiments, input/output controller 170 may be coupled to input/output devices (e.g., monitor 175, a mouse, a keyboard, or other input/output devices) and to communication link 180. The input/output devices may receive and transmit data in analog or digital form over communication link 180.

Memory 150 may store instructions (e.g., computer code) associated with an operating system, computer applications, and other resources. Memory 150 may also store application data and data objects that may be interpreted by one or more applications or virtual machines running on computing subsystem 110. Memory 150 may include microseismic data 151, geological data 152, and applications 158. In some implementations, a memory of a computing device may include additional or different data, applications, models, or other information.

Microseismic data 151 may include information for microseismic events in a subterranean region, such as the microseismic event data described above. For example, with regard to FIG. 1A, microseismic data 151 may include information based on acoustic data collected by sensors 136 at wellbore 102, at surface 106, or at other locations within subterranean region 104. In some embodiments, microseismic data 151 may include information that has been combined with other data, reformatted, or otherwise processed. Microseismic data 151 may include any suitable information relating to microseismic events (e.g., locations, times, magnitudes, moments, uncertainties, etc.). Microseismic data 151 may include data collected from one or more stimulation treatments, which may include data collected before, during, or after a fluid injection.

Geological data 152 may include information on geological properties of subterranean region 104. For example, with regard to FIG. 1A, geological data 152 may include information on wellbore 102, or information on other attributes of subterranean region 104. In some embodiments, geological data 152 may include information on lithology, fluid content, stress profile, pressure profile, spatial extent, or other attributes of one or more rock formations in subterranean region 104. Geological data 152 may further include information collected from well logs, rock samples, outcroppings, microseismic imaging, or other data sources.

Treatment data 155 may include information on properties of a planned treatment of subterranean region 104. For example, with regard to FIG. 1A, treatment data 155 may include information identifying locations of perforations 138. In some embodiments, treatment data 155 may include information on a pumping schedule for a treatment stage, such a fluid volume, fluid pumping rate, or fluid pumping pressure.

Applications 158 may include software applications, scripts, programs, functions, executables, or other modules that may result in code or instructions that are executed by processor 160. The applications 158 may include computer-readable instructions for performing one or more operations related to FIGS. 2A, 2B, and 3-5. Applications 158 may obtain input data, such as treatment data 155, geological data 152, microseismic data 151, or other types of input data, from memory 150, from another local source, or from one or more remote sources (e.g., via communication link 180). Applications 158 may generate output data and store output data in memory 150, in another local medium, or in one or more remote devices (e.g., by sending output data via communication link 180). Applications 158 may include computer-readable instructions for generating a user interface or a plot, for example, illustrating fracture geometry (e.g., length, width, spacing, orientation, etc.), geometric representations of an SRV, an SRV overlap, SRV uncertainty, etc.

Communication link 180 may include any type of communication channel, connector, data communication network, or other link. For example, communication link 180 may include a wireless or a wired network, a Local Area Network (LAN), a Wide Area Network (WAN), a private network, a public network (such as the Internet), a WiFi network, a network that includes a satellite link, a serial link, a wireless link (e.g., infrared, radio frequency, or others), a parallel link, or another type of data communication network.

In some implementations, microseismic event data may be collected from a stimulation treatment, such as a multi-stage hydraulic fracturing treatment. Based on locations of the microseismic events in a subterranean region, a geometrical representation of the SRV may be constructed, and a quantitative representation of a SRV may be calculated based on the geometrical representation. A geometrical representation may include, for example, a three-dimensional (3D) or a two-dimensional (2D) minimum convex polygon enclosing some or all of the microseismic events. A geometrical representation may include plots, tables, charts, graphs, coordinates, vector data, maps or other geometrical objects. In some implementations, in addition to a volume of the calculated SRV for a stimulated subterranean region, other geometric properties (e.g., a length, width, height, orientation) of an SRV may be identified based on a geometrical representation. Geometric properties may be used to characterize a stimulated subterranean region. For example, a geometrical representation may indicate an extension of hydraulic fractures in a stimulated subterranean formation, which may be used to estimate a production capacity within the formation.

In the following figures and description, reference is made to various geometrical elements. As used herein, a "line" defines a straight collection of points having zero thickness and extending in both directions to any arbitrary length or to infinity. As used herein, a "line segment" defines a line with a specific length defined by two respective endpoints. As used herein, a "vector" is a line segment having a particular orientation. Vector quantities are presented in boldface herein. As used herein, a "normal vector" is a vector that is perpendicular to a reference element. As used herein, a "projection" of a first vector onto a line is an orthogonal component of the first vector along the line. As a scalar quantity, a projection A of vector a onto line b having an angle θ therebetween is given by A=|a| cos θ. A projection may be projected onto a vector or a line.

Referring now to FIGS. 2A and 2B, plots 201 of triangulated data are shown. The triangulated data are used for improved data-driven estimation of SRV using locally adaptive alpha shapes. Specifically, plots 200 and 201 show how a local density at a point S in the set of data points may be estimated using length d associated with line segment D 210. Length d associated with line segment D 210 may be inversely related to the local density at data point S.

In FIG. 2A, plot 200 depicts triangulation at an interior point in the data set, while in FIG. 2B plot 201 depicts triangulation at a boundary point of the data set. The boundary point is located on the convex hull of the data set. The data sets shown in plots 200 and 201 may originate from microseismic event data at a subterranean formation and the axes of plots 200 and 201 may refer to an arbitrary distance scale in two dimensions (2D). Although plots 200 and 201 are depicted as 2D triangulations for descriptive clarity, it will be understood that corresponding plots for three dimensional (3D) data may be similarly generated.

In FIGS. 2A and 2B, a common legend shows the elements within each plot 200 and 201. Data points 202 represent each data point S in the set of data points. The set of data points may be input data for the methods described herein and may represent various physical phenomena, such as microseismic event data. In plots 200 and 201, data points 202 are joined with Delaunay triangulation 204 using the Delaunay triangulation algorithm, forming triangles between three adjacent data points 202 in 2D, as shown. In 3D (not shown), Delaunay triangulation 204 may result in tetrahedra between four adjacent data points 202. As used herein, the term "polytope" is a generalization for any dimension of geometric elements having flat sides, used for Delaunay triangulation 204. Thus, in 2D, polytopes of Delaunay triangulation 204 are triangles, while in 3D, polytopes of Delaunay triangulation 204 are tetrahedra. Furthermore, as used herein, the term "facet" refers to an n−1 dimensional element that bounds an n dimensional polytope. Accordingly, in 2D, a triangular polytope includes 3 facets that are one dimensional (1D) line segments, while in 3D, a tetrahedral polytope includes 4 facets that are 2D faces. The vertices of a polytope are zero dimensional points (i.e., data points 202) that bound a facet.

Also shown in plots 200 and 201 are Voronoi polygons 206 for representative data points 202. A Voronoi polygon about a point represents a polygon whose edges are closer to the point than any other point. In general, the Voronoi polygon V includes positive pole $p^+$, which is a vertex of V that is located farthest from point S, about which V is constructed. In general, the Voronoi polygon V includes negative pole $p^-$, which is a second vertex of V such that a line vector $Sp^-$ represents a maximum negative projection on the line vector $Sp^+$. A line $p^+S$ 208 may thus be determined for Voronoi polygon V, and a line segment D 210 on line $p^+S$ 208 may be obtained. As will be described in further detail, because length d for point S is generated using data-driven methods that do not depend on an input parameter or other a priori assumption regarding local density, an improved and reliable estimation of the enclosed surface and corresponding enclosed volume of the set of data points may be generated.

In FIG. 2A, plot 200 depicts triangulation of a data point at an interior of the set of data points, which may be referred to as data point $S_i$ having corresponding Voronoi polygon $V_i$. Voronoi polygon $V_i$ will include positive pole $p^+$ and negative pole $p^-$, from which line $p^+S$ 208 and line segment D 210 may be constructed, thereby allowing for determination of length d as the length of line segment D 210.

Corresponding to plot 200 in FIG. 2A, for interior point $S_i$, length d may be calculated as follows:

Let $S_i$ be an interior point having Voronoi polygon $V_i$.

Let $V_i$ have m vertices $p_j$ (j=1, 2, . . . , m).

Generate vectors directed from $S_i$ to $p_j$, respectively labeled as $a_j$ (j=1, 2, . . . , m).

Find $j=J_1$ such that $|a_j|$ is a maximum where $|a_j|$ denotes a magnitude of vector $a_j$.

Label the vertex $p_{J_1}$ as point $p_i^+$, which is a positive pole of $V_i$ that lies farthest from $S_i$.

Find $j=J_2$ such that $$\frac{a_{J_1} \cdot a_j}{|a_{J_1}|} \leq 0 \text{ and } \left|\frac{a_{J_1} \cdot a_j}{|a_{J_1}|}\right|$$

is a maximum for all j where $a_{J_1} \cdot a_j$ denotes a dot product of vectors $a_{J_1}$ and $a_j$.

Label the vertex $p_{J_2}$ as point $p_i^-$, which is a negative pole of $V_i$ and indicates the vertex of $V_i$ such that a vector $S_i p_i^-$ makes a maximum negative projection $a_{J_1}$.

Compute a value d for $V_i$ as $$d = |a_{J_1}| + \left|\frac{a_{J_1} \cdot a_{J_2}}{|a_{J_1}|}\right|.$$

In FIG. 2B, plot 201 depicts a special case of triangulation of a data point at the boundary of the set of data points, which may be referred to as data point $S_e$ having corresponding Voronoi polygon $V_e$. Because data point $S_e$ is at the boundary of the set of data points, Voronoi polygon $V_e$ will extend to infinity and, therefore, the positive pole $p^+$ will be at infinity. In the case of Voronoi polygon $V_e$, a different method may be used to derive line $p^+S$ 208 than in the case of Voronoi polygon $V_i$ (see FIG. 2A). Specifically, to estimate line $p^+S$ 208 for Voronoi polygon $V_e$, outward normal vectors of the boundary facets of the polytopes adjacent to data point $S_e$ may be averaged. In the 2D case, outward normal vectors from the boundary edges of the two triangles adjacent to data point $S_e$ may be averaged to estimate line $p^+S$ 208. Then, line segment D 210 having length d/2 may be determined as a projection of $p^-S_e$ on the estimated line $p^+S_e$ 208, thereby allowing for calculation of d. It is noted that the choice of length d/2 may be modified to other values, for example, based on a type of boundary treatment that is applied for a given application.

Corresponding to plot 201 in FIG. 2B, for boundary point $S_e$, length d may be calculated as follows:

Let $S_e$ be a boundary point having Voronoi polygon $V_e$. By definition, $V_e$ is an unclosed polygon.

Let $V_e$ have m vertices $p_j$ (j=1, 2, . . . , m).

Compute a vector $n_b$ as an average vector of outward normal vectors (with respect to the boundary) to boundary facets connected to the point $S_e$.

Generate vectors directed from $S_e$ to $p_j$, respectively labeled as $a_j$ (j=1, 2, . . . , n).

Find $j=J_2$ such that $$\frac{n_b \cdot a_j}{|n_b|} < 0 \text{ and } \left|\frac{n_b \cdot a_j}{|n_b|}\right|$$

is a maximum for all j.

Label the vertex $p_{J_2}$ as point $p_e^-$, which is a negative pole of $V_e$ and indicates the vertex of $V_e$ such that a vector $S_e p_e^-$ makes a maximum negative projection on $n_b$.

Compute a value d for $V_e$ as $$d = 2 * \left|\frac{n_b \cdot a_{J_2}}{|n_b|}\right|.$$

Referring now to FIGS. 3A, 3B, and 3C, plots 300, 301, and 302 of an improved data-driven estimation of SRV using locally adaptive alpha shapes are shown. Plots 300, 301, and 302 show results of the methods described herein for data driven estimation of SRV using locally adaptive alpha shapes for different stages within a single well. The wellbore path 312 along with individual perforations into the geological formation show a relative location of each respective SRV in plots 300, 301, and 302. The axes of plots 300, 301, and 302 may represent arbitrary distance scales. Plots 300, 301, and 302 include 3D data and a 2D projection of the 3D data. The 2D projections depicted in plots 300, 301, 302 may be independently calculated from the respective data sets and may be different from simple projections of the 3D optimized alpha-shape. The examples presented in plots 300, 301, and 302 demonstrate how typical errors incurred by considering a convex hull based SRV may be significant.

In FIG. 3A plot 300, data points 303-1 are shown for the 3D data and the 2D projection. A conventional 3D volume 306-1 (also referred to as a "convex hull") representing a minimum convex polygon that completely encloses the set of data points 303-1 is shown. An improved 3D volume 304-1 (also referred to as a "concave hull") generated using the data-driven estimation according to the methods described herein may relax the convexity constraint of conventional 3D volume 306-1 and may avoid enclosing large unstimulated voids, resulting in an improved estimation of SRV. In plot 300, a difference in SRV from the 3D volumes 304-1 and 306-1 of −37% is shown for a stage I treatment within wellbore 312. For plot 300, a difference in SRV from the 2D projections 308-1 and 310-1 is about −15%, indicating the 3D nature of the voids. Improved 2D projection 308-1 corresponds to improved 3D volume 304-1 while conventional 2D projection 310-1 corresponds to conventional 3D volume 306-1.

In FIG. 3B plot 301, data points 303-2 are shown for the 3D data and the 2D projection. A conventional 3D volume 306-2 representing a minimum convex polygon that completely encloses the set of data points 303-2 is shown. An improved 3D volume 304-2 generated using the data-driven estimation according to the methods described herein may relax the convexity constraint of conventional 3D volume 306-2 and may avoid enclosing large unstimulated voids, resulting in an improved estimation of SRV. In plot 302, a difference in SRV from the 3D volumes 304-2 and 306-2 of −43% is shown for a stage III treatment within wellbore 312. For plot 301, a difference in SRV from the 2D projections 308-2 and 310-2 is about −18%, indicating the 3D nature of the voids. Improved 2D projection 308-2 corresponds to improved 3D volume 304-2, while conventional 2D projection 310-2 corresponds to conventional 3D volume 306-2.

In FIG. 3C plot 302, data points 303-3 are shown for the 3D data and the 2D projection. A conventional 3D volume 306-3 representing a minimum convex polygon that completely encloses the set of data points 303-3 is shown. An improved 3D volume 304-3 generated using the data-driven estimation according to the methods described herein may relax the convexity constraint of conventional 3D volume 306-3 and may avoid enclosing large unstimulated voids, resulting in an improved estimation of SRV. In plot 303, a difference in SRV from the 3D volumes 304-3 and 306-3 of −38% is shown for a multistage treatment, including stages I, II, III, and IV, within wellbore 312. The individual stages are shown as different data points 303-3. For plot 303, a difference in SRV from the 2D projections 308-3 and 310-3 is about −17%, indicating the 3D nature of the voids. Improved 2D projection 308-3 corresponds to improved 3D volume 304-3, while conventional 2D projection 310-3 corresponds to conventional 3D volume 306-3.

Referring now to FIG. 4, a flow chart of method 400 for generating an optimized surface from a set of data points using locally adaptive alpha shapes, as described herein, is illustrated. The optimized surface generated in method 400 allows for improved data-driven estimation of the enclosed volume that the optimized surface bounds. Method 400, in conjunction with methods 500 and 600 (see FIGS. 5 and 6) may be referred to as a density optimized alpha-shape (DOAS) algorithm that may be used for an improved data-driven estimation of stimulated reservoir volume (SRV) using locally adaptive alpha shapes. It is noted that certain operations described in method 400 may be optional or may be rearranged in different embodiments.

Method 400 begins at step 402 by triangulating a set of data points according to the Delaunay triangulation algorithm to generate a set of polytopes, such that each of the polytopes P has vertices from the set of data points and the set of polytopes is bounded by a convex hull. The convex hull may correspond to conventional 3D volume 306 (see FIG. 3). At step 404, for each point S in the set of data points, a Voronoi polygon V may be generated. At step 406, based on the Voronoi polygon V respectively for each point S, a value d may be determined for each point S, such that the value d is indicative of the inverse of a local density in the set of data points at the point S (see also FIGS. 2A, 2B, and 5). At step 408, for each polytope P, method 500 may determine whether P is retained for an optimized surface, based on the values d for each point S corresponding to a vertex of P (see also FIG. 5). At step 410, the optimized surface may be generated from the retained polytopes P. Finally, at step 412, a stimulated reservoir volume (SRV) may be identified for the treatment based on the optimized surface.

Referring now to FIG. 5, a flow chart of method 500 for determining whether each polytope P is retained for an optimized surface, as described herein, is illustrated. As shown, method 500 may represent an embodiment of step 408 in method 400 (see FIG. 4). As used in method 500, the term 'next polytope P' refers to a currently selected polytope P that was previously unselected during the iterative procedure and does not explicitly or implicitly disclose any ordering within the set of polytopes. It is noted that certain operations described in method 500 may be optional or may be rearranged in different embodiments.

In method 500, an iterative procedure over the set of polytopes may be performed at steps 502 to 514. It is noted that various types of iterative procedures, such as for-loops, while-loops, etc., may be used to iterate operations 502 to 514 over the set of polytopes. At step 502, a next polytope P from the set of polytopes may be selected. It is noted that various types of ordering of polytopes P may be used with the iterative procedure in method 500. At step 504, a minimum value $d_{min}$ may be calculated from values of d for each of the vertices S (i.e., data points S) of the next polytope P. At step 506, the minimum value $d_{min}$ is assigned to a characteristic variable α for the next polytope P. In different embodiments, the selection of the minimum value $d_{min}$ may be replaced with other statistical measures of the values for d, for example, with an average of the values for d. At step 508, a determination may be made whether α is greater than or equal to $r_c$ where $r_c$ is a circumradius of the next polytope P. When α is less than $r_c$, at step 510, the next polytope P may be discarded from the optimized surface. When α is greater than or equal to $r_c$, at step 512, the next polytope P may be retained for the optimized surface. After steps 510 or 512, at step 514, an iterative determination may be made whether any unselected polytopes P remain. When unselected polytopes P remain, method 500 may iteratively loop back to step 502. When no unselected polytopes P remain, the iterative procedure may be completed and method 500 may advance to operation 410.

Referring now to FIG. 6, a flow chart of method 600 for determining a value of d for each point S, as described herein, is illustrated. As shown, method 600 may represent an embodiment of step 406 in method 400 (see FIG. 4). As used in method 600, the term 'next point S' refers to a currently selected point S that was previously unselected during the iterative procedure and does not explicitly or implicitly disclose any ordering within the set of points. It is noted that certain operations described in method 600 may be optional or may be rearranged in different embodiments.

Method 600 may begin at step 602 after step 404 in method 400. Then in method 600, an iterative procedure over the set of data points may be performed at steps 602 to 616. It is noted that various types of iterative procedures, such as for-loops, while-loops, etc., may be used to iterate operations 602 to 616 over the set of data points. At step 602, a next point S from the set of points and corresponding to Voronoi polygon V may be selected. It is noted that various types of ordering of points S may be used with the iterative procedure in method 600. At step 604, a determination may be made whether the next point S does lie on the convex hull. When the next point S does not lie on the convex hull, at step 606, a line $p^+S$ may be determined for the Voronoi polygon V. At step 606, $p^+$ is a first vertex of Voronoi polygon V located farthest from S. At step 608, a line segment D having length d may be determined corresponding to a projection of a vector $p^+p^-$ on the line $p^+S$. At step 608, the point $p^-$ is a negative pole of Voronoi polygon V that is a second vertex of V such that a vector $Sp^-$ makes a maximum negative projection on a vector $Sp^+$ among all vertices of V. When the next point S does lie on the convex hull, at step 610, a line $p^+S$ may be estimated by an average direction of normal vectors directed outward from the convex hull for boundary facets of polytopes P adjacent to the point S. The point $p^+$ at step 610 is positive pole of Voronoi polygon V that is a farthest point (or a point that is arbitrarily far) outward from the convex hull on the line $p^+S$ from point S. At step 612, a line segment D having length d/2 may be determined corresponding to a projection of a vector $Sp^-$ on the estimated line $p^+S$. The point $p^-$ at step 612 is a negative pole of Voronoi polygon V that that is a vertex of V such that a vector $Sp^-$ makes a maximum negative projection on a vector $Sp^+$ among all vertices of V. At step 614, d may be calculated. After step 614 or step 608, an iterative determination may be made whether any unselected points S remain. When unselected points S remain, method 600 may iteratively loop back to step 602. When no unselected points S remain, the iterative procedure may be completed and method 600 may proceed to step 408.

In a first aspect, a method is disclosed for determining a stimulated reservoir volume. The method may include obtaining a set of data points including microseismic event data corresponding to a treatment of a subterranean formation. The method may further include triangulating the set of data points according to the Delaunay Triangulation algorithm to generate a set of polytopes. Each of the polytopes P may have vertices from the set of data points. The set of polytopes may be bounded by a convex hull. For each point S in the set of data points, the method may include generating a Voronoi polygon V about S. Based on the Voronoi polygon V respectively for each point S, the method may include determining a value d for each point S. The value d may be indicative of a local density in the set of data points at the point S. For each polytope P, the method may include determining whether the polytope P is retained for an optimized surface, based on the values d for each point S corresponding to a vertex of P. The method may also include generating the optimized surface from the retained polytopes P, and identifying a stimulated reservoir volume (SRV) for the treatment based on the optimized surface.

In a second aspect, a disclosed article of manufacture includes a non-transitory computer-readable medium storing instructions for generating an optimized surface from a set of data points. The instructions, when executed by a processor, may cause the processor to triangulate the set of data points according to the Delaunay Triangulation algorithm to generate a set of polytopes. Each of the polytopes P may have vertices from the set of data points. The set of polytopes may be bounded by a convex hull. For each point S in the set of data points, the instructions may be to generate a Voronoi polygon V about S. Based on the Voronoi polygon V respectively for each point S, the instructions may be to determine a value d for each point S. The value d may be indicative of a local density in the set of data points at the point S. For each polytope P, the instructions may be to calculate a minimum value $d_{min}$ from values of d for each of the vertices S of the polytope P, and to assign the minimum value $d_{min}$ to a characteristic variable α for the polytope P. When $α≥r_c$, where $r_c$ is a circumradius of the polytope P, the instructions may be to retain the polytope P for the optimized surface, else the instructions may be to discard the polytope P from the optimized surface. The instructions may further be to generate the optimized surface from the retained polytopes P.

In a third aspect, a disclosed computer system is for generating an optimized surface from a set of data points. The computer system may include a processor having access to a memory. The memory may store instructions executable by the processor. The instructions, when executed by the processor, may cause the processor to triangulate the set of data points according to the Delaunay Triangulation algorithm to generate a set of polytopes. Each of the polytopes P may have vertices from the set of data points. The set of polytopes may be bounded by a convex hull. For each point S in the set of data points, the instructions may be to generate a Voronoi polygon V about S. Based on the Voronoi polygon V respectively for each point S, the instructions may be to determine a value d for each point S. The value d may be indicative of a local density in the set of data points at the point S. For each polytope P, the instructions may be to calculate a minimum value $d_{min}$ from values of d for each of the vertices S of the polytope P, and to assign the minimum value $d_{min}$ to a characteristic variable α for the polytope P. When $α≥r_c$, where $r_c$ is a radius of a circumcircle of the polytope P, the instructions may be to retain the polytope P for the optimized surface, else the instructions may be to discard the polytope P from the optimized surface. The instructions may further be to generate the optimized surface from the retained polytopes P.

In any embodiment of each of the disclosed aspects, each of the polytopes P may be a triangle. Each of the polytopes P may be a tetrahedron. The optimized surface may enclose the SRV for the subterranean formation.

In any embodiment of each of the disclosed aspects, for each point $S_i$ in the set of data points not located at the convex hull and corresponding Voronoi polygon $V_i$, determining the value d for each point $S_i$ may include determining a line $p_i^+S_i$, $p_i^+$ being a positive pole of the Voronoi polygon $V_i$, $p_i^+$ being a first vertex of $V_i$ located farthest from $S_i$. Determining the value d for each point $S_i$ may further include determining a line segment D having a length corresponding to the value d, the line segment D corresponding to a projection of a vector $p_i^+p_i^-$ on the line $p_i^+S_i$, $p_i^-$ being a negative pole $p^-$ of the Voronoi polygon $V_i$, $p_i^-$ being a second vertex of $V_i$ such that a vector $S_ip_i^-$ makes a maximum negative projection on a vector $S_ip_i^+$ among all vertices of $V_i$.

In any embodiment of each of the disclosed aspects, for each point $S_e$ in the set of data points located at the convex hull and corresponding Voronoi polygon $V_e$, determining the value d for each point $S_e$ may include estimating a line $p_e^+S_e$ given by an average direction of normal vectors directed outward from the convex hull for boundary facets of polytopes P adjacent to the point $S_e$, such that $p_e^+$ is a farthest point outward from the convex hull on the line $p_e^+S_e$ from $S_e$. Determining the value d for each point $S_e$ may further include determining a line segment D having length d/2 corresponding to a projection of a vector $S_ep_e^-$ on the estimated line $p_e^+S_e$, $p_e^-$ being a negative pole $p^-$ of the Voronoi polygon $V_e$, $p_e^-$ being a second vertex of $V_e$ such that a vector $S_ep_e^-$ makes a maximum negative projection on a vector $S_ep_e^+$ among all vertices of $V_e$, and calculating d.

In any embodiment of each of the disclosed aspects, for each polytope P, determining whether the polytope P is retained for the optimized surface may include calculating a minimum value $d_{min}$ from values of d for each of the vertices S of the polytope P, and assigning the minimum value $d_{min}$ to a characteristic variable α for the polytope P. When $α≥r_c$, where $r_c$ is a circumradius of the polytope P, determining whether the polytope P is retained for the optimized surface may include retaining the polytope P for the optimized surface, else determining whether the polytope P is retained for the optimized surface may include discarding the polytope P from the optimized surface.

As disclosed herein, a method for improved data-driven estimation of a stimulated reservoir volume may generate an optimized surface that encloses a set of data points including microseismic event data corresponding to a treatment of a subterranean formation. A Delauney triangulation may be performed on the set of data points to generate a set of polytopes. A Voronoi polygon may be generated about each data point and used to obtain a local density measure that is locally and adaptively determined for each data point. Based on the local density measure, polytopes in the set of polytopes may be discriminated for inclusion in the optimized surface.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein or in the absence of any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each item of the list. The phrase "at least one of" allows a meaning that includes at least one of any one of the items, at least one of any combination of the items, and at least one of each of the items. By way of example, the phrases "at least one of A, B, and C" or "at least one of A, B, or C" may each refer to only A, only B, or only C; any combination of A, B, and C; or at least one of each of A, B, and C.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A computer-implemented method for determining a stimulated reservoir volume, the method comprising:
    obtaining a set of data points including microseismic event data corresponding to a treatment of a subterranean formation;
    triangulating the set of data points according to the Delaunay Triangulation algorithm to generate a set of polytopes, each of the polytopes P having vertices from the set of data points, and the set of polytopes being bounded by a convex hull;
    for each point S in the set of data points, generating a Voronoi polygon V about S;
    based on the Voronoi polygon V respectively for each point S, determining a value d for each point S, the value d being indicative of a local density associated with the set of data points near the point S; and
    for each polytope P, determining whether the polytope P for an optimized surface is discarded, based on the values d for each point S corresponding to a vertex of P;
    generating the optimized surface from the remaining polytopes P; and
    identifying a stimulated reservoir volume (SRV) for the treatment based on the optimized surface.

2. The method of claim 1, wherein each of the polytopes P is a triangle.

3. The method of claim 1, wherein each of the polytopes P is a tetrahedron.

4. The method of claim 1, wherein the optimized surface encloses the SRV for the subterranean formation.

5. The method of claim 1, wherein determining the value d for each point S includes:
    for each point $S_i$ in the set of data points not located at the convex hull and corresponding Voronoi polygon $V_i$:
        determining a line $p_i^+ S_i$, $p_i^+$ being a positive pole of the Voronoi polygon $V_i$, $p_i^+$ being a first vertex of $V_i$ located farthest from $S_i$; and
        determining a line segment D having a length corresponding to the value d, the line segment D corresponding to a projection of a vector $p_i^+ p_i^-$ on the line $p_i^+ S_i$, $p_i^-$ being a negative pole $p^-$ of the Voronoi polygon $V_i$, $p_i^-$ being a second vertex of $V_i$ such that a vector $S_i p_i^-$ makes a maximum negative projection on a vector $S_i p_i^+$ among all vertices of $V_i$.

6. The method of claim 1, wherein determining the value d for each point S includes:
    for each point $S_e$ in the set of data points located at the convex hull and corresponding Voronoi polygon $V_e$:
        estimating a line $p_e^+ S_e$ given by an average direction of normal vectors directed outward from the convex hull for boundary facets of polytopes P adjacent to the point $S_e$, such that $p_e^+$ is a farthest point outward from the convex hull on the line $p_e^+ S_e$ from $S_e$;
        determining a line segment D having length d/2 corresponding to a projection of a vector $S_e p_e^-$ on the estimated line $p_e^+ S_e$, $p_e^-$ being a negative pole $p^-$ of the Voronoi polygon $V_e$, $p_e^-$ being a vertex of $V_e$ such that a vector $S_e p_e^-$ makes a maximum negative projection on a vector $S_e p_e^+$ among all vertices of $V_e$; and
        calculating d.

7. The method of claim 1, wherein determining whether the polytope P for the optimized surface is discarded includes:
    for each polytope P:
        calculating a minimum value $d_{min}$ from values of d for each of the vertices S of the polytope P;
        assigning the minimum value $d_{min}$ to a characteristic variable α for the polytope P; and
        when $α ≤ r_c$, where $r_c$ is a circumradius of the polytope P, discarding the polytope P from the optimized surface, else retaining the polytope P for the optimized surface.

8. The method of claim 1, wherein the value d is inversely related to the local density.

9. An article of manufacture comprising a non-transitory computer-readable medium storing instructions for determining a stimulated reservoir volume, wherein the instructions, when executed by a processor, cause the processor to:

obtain a set of data points including microseismic event data corresponding to a treatment of a subterranean formation;

triangulate the set of data points according to the Delaunay Triangulation algorithm to generate a set of polytopes, each of the polytopes P having vertices from the set of data points, and the set of polytopes being bounded by a convex hull;

for each point S in the set of data points, generate a Voronoi polygon V about S;

based on the Voronoi polygon V respectively for each point S, determine a value d for each point S, the value d being indicative of a local density associated with the set of data points near the point S; and for each polytope P, determine whether the polytope P for an optimized surface is discarded, based on the values d for each point S corresponding to a vertex of P;

generate the optimized surface from the remaining polytopes P; and identify a stimulated reservoir volume (SRV) for the treatment based on the optimized surface.

10. The article of manufacture of claim 9, wherein each of the polytopes P is a triangle.

11. The article of manufacture of claim 9, wherein each of the polytopes P is a tetrahedron.

12. The article of manufacture of claim 9, wherein the optimized surface encloses the SRV for the subterranean formation.

13. The article of manufacture of claim 9, wherein the instructions to determine the value d for each point S include instructions to:

for each point $S_i$ in the set of data points not located at the convex hull and corresponding Voronoi polygon $V_i$:

determining a line $p_i^+ S_i$, $p_i^+$ being a positive pole of the Voronoi polygon $V_i$, $p_i^+$ being a first vertex of $V_i$ located farthest from $S_i$; and determining a line segment D having a length corresponding to the value d, the line segment D corresponding to a projection of a vector $p_i^+ p_i^-$ on the line $p_i^+ S_i$, $p_i^-$ being a negative pole $p^-$ of the Voronoi polygon $V_i$, $p_i^-$ being a second vertex of $V_i$ such that a vector $S_i p_i^-$ makes a maximum negative projection on a vector $S_i p_i^+$ among all vertices of $V_i$.

14. The article of manufacture of claim 9, wherein the instructions to determine the value d for each point S include instructions to:

for each point $S_e$ in the set of data points located at the convex hull and corresponding Voronoi polygon $V_e$:

estimating a line $p_e^+ S_e$ by an average direction of normal vectors directed outward from the convex hull for boundary facets of polytopes P adjacent to the point $S_e$, $p_e^+$ being a farthest point outward from the convex hull on the line $p_e^+ S_e$ from $S_e$;

determining a line segment D having length d/2 corresponding to a projection of a vector $S_e p_e^-$ on the estimated line $p_e^+ S_e$, $p_e^-$ being a negative pole $p^-$ of the Voronoi polygon $V_e$, $p_e^-$ being a vertex of $V_e$ such that a vector $S_e p_e^-$ makes a maximum negative projection on a vector $S_e p_e^+$ among all vertices of $V_e$; and calculating d.

15. The article of manufacture of claim 9, wherein instructions to determine whether the polytope P for the optimized surface is discarded include instructions to:

for each polytope P:

calculate a minimum value $d_{min}$ from values of d for each of the vertices S of the polytope P;

assign the minimum value $d_{min}$ to a characteristic variable α for the polytope P; and when $α ≤ r_c$, where $r_c$ is a circumradius of the polytope P, discarding the polytope P from the optimized surface, else retaining the polytope P for the optimized surface.

16. The article of manufacture of claim 9, wherein the value d is inversely related to the local density.

17. A computer system for determining a stimulated reservoir volume, the computer system comprising:

a processor; and a memory communicatively coupled to the processor, the memory storing instructions executable by the processor, wherein the instructions, when executed by the processor, cause the processor to:

obtain a set of data points including microseismic event data corresponding to a treatment of a subterranean formation;

triangulate the set of data points according to the Delaunay Triangulation algorithm to generate a set of polytopes, each of the polytopes P having vertices from the set of data points, and the set of polytopes being bounded by a convex hull;

for each point S in the set of data points, generate a Voronoi polygon V about S;

based on the Voronoi polygon V respectively for each point S, determine a value d for each point S, the value d being indicative of a local density associated with the set of data points near the point S; and for each polytope P, determine whether the polytope P for an optimized surface is discarded, based on the values d for each point S corresponding to a vertex of P;

generate the optimized surface from the remaining polytopes P; and identify a stimulated reservoir volume (SRV) for the treatment based on the optimized surface.

18. The computer system of claim 17, wherein each of the polytopes P is a triangle.

19. The computer system of claim 17, wherein each of the polytopes P is a tetrahedron.

20. The computer system of claim 17, wherein the optimized surface encloses the SRV for the subterranean formation.

21. The computer system of claim 17, wherein the instructions to determine the value d for each point S include instructions to:

for each point $S_i$ in the set of data points not located at the convex hull and corresponding Voronoi polygon $V_i$:

determining a line $p_i^+ S_i$, $p_i^+$ being a positive pole of the Voronoi polygon $V_i$, $p_i^+$ being a first vertex of $V_i$ located farthest from $S_i$; and determining a line segment D having a length corresponding to the value d, the line segment D corresponding to a projection of a vector $p_i^+ p_i^-$ on the line $p_i^+ S_i$, $p_i^-$ being a negative pole $p^-$ of the Voronoi polygon $V_i$, $p_i^-$ being a second vertex of $V_i$ such that a vector $S_i p_i^-$ makes a maximum negative projection on a vector $S_i p_i^+$ among all vertices of $V_i$.

22. The computer system of claim 17, wherein the instructions to determine the value d for each point S include instructions to:

for each point $S_e$ in the set of data points located at the convex hull and corresponding Voronoi polygon $V_e$:

estimating a line $p_e^+ S_e$ given by an average direction of normal vectors directed outward from the convex hull for boundary facets of polytopes P adjacent to the point $S_e$, $p_e^+$ being a farthest point outward from the convex hull on the line $p_e^+ S_e$ from $S_e$;

determining a line segment D having length d/2 corresponding to a projection of a vector $S_e p_e^-$ on the estimated line $p_e^+ S_e$, $p_e^-$ being a negative pole $p^-$ of the Voronoi polygon $V_e$, $p_e^-$ being a vertex of $V_e$ such that a vector $S_e p_e^-$ makes a maximum negative projection on a vector $S_e p_e^+$ among all vertices of $V_e$; and calculating d.

23. The computer system of claim 17, wherein the instructions to determine whether the polytope P for the optimized surface is discarded includes:

for each polytope P:
calculate a minimum value $d_{min}$ from values of d for each of the vertices S of the polytope P;
assign the minimum value $d_{min}$ for the polytope P to a value $\alpha$; and
when $\alpha \leq r_c$, where $r_c$ is a circumradius of the polytope P, discarding the polytope P from the optimized surface, else retaining the polytope P for the optimized surface.

24. The computer system of claim 17, wherein the value d is inversely related to the local density.

* * * * *